US012609268B2

(12) United States Patent
Thorne et al.

(10) Patent No.: US 12,609,268 B2
(45) Date of Patent: Apr. 21, 2026

(54) SAMPLE SUPPORTS FOR CRYO-ELECTRON MICROSCOPY

(71) Applicant: MiTeGen, LLC, Ithaca, NY (US)

(72) Inventors: Robert Thorne, Ithaca, NY (US); Tyler Engstrom, Ithaca, NY (US); Richard Jayne, Lansing, NY (US)

(73) Assignee: MiTeGen, LLC, Ilthaca, NY (US)

( * ) Notice: Subject to any disclaimer, the term of this patent is extended or adjusted under 35 U.S.C. 154(b) by 387 days.

(21) Appl. No.: 18/559,750

(22) PCT Filed: Jun. 3, 2022

(86) PCT No.: PCT/US2022/032046
§ 371 (c)(1),
(2) Date: Nov. 8, 2023

(87) PCT Pub. No.: WO2022/256588
PCT Pub. Date: Dec. 8, 2022

(65) Prior Publication Data
US 2024/0242926 A1 Jul. 18, 2024

Related U.S. Application Data

(60) Provisional application No. 63/197,077, filed on Jun. 4, 2021.

(51) Int. Cl.
*H01J 37/20* (2006.01)
(52) U.S. Cl.
CPC .................................... *H01J 37/20* (2013.01)
(58) Field of Classification Search
USPC ...................................................... 250/440.11
See application file for complete search history.

(56) References Cited

U.S. PATENT DOCUMENTS 7,263,162 B2 8/2007 Thorne et al.
8,210,057 B2 7/2012 Thorne et al.
(Continued)

FOREIGN PATENT DOCUMENTS

WO 2021067940 A1 4/2021

OTHER PUBLICATIONS

Eugen Ermantraut, et al., "Perforated 1-15 INV. Support Foils with Pre-defined Hole Size, Shape and Arrangement", Ultramicroscopy, vol. 74, No. 1-2, pp. 75-81 (Jul. 1, 1998).
(Continued)

*Primary Examiner* — Kiet T Nguyen
(74) *Attorney, Agent, or Firm* — Quinn IP Law

(57) ABSTRACT

Presented are sample-supporting foils and grids for cryo-electron microscopy (cryo-EM) systems, methods for making/using disclosed cryo-EM foils, grids, devices, and/or systems, and cryo-EM systems equipped with disclosed foils, grids, and/or devices. A sample-support grid assembly may include a grid body with opposing first and second grid surfaces and multiple grid holes extending through the grid body from the first grid surface to the second grid surface. A foil sheet is seated against the first surface and covers at least a subset of the grid holes in the grid body. The foil sheet includes multiple foil regions filled with foil holes and separated from each other by multiple elongated slots. These elongated slots enable the foil regions to move with respect to each other when the grid assembly is under load. The slots of the foil sheet may be arranged in an auxetic pattern.

20 Claims, 13 Drawing Sheets

(56) References Cited

U.S. PATENT DOCUMENTS

| | | | |
|---|---|---|---|
| 9,417,166 B2 | 8/2016 | Thorne et al. | |
| 9,855,557 B2 | 1/2018 | Thorne et al. | |
| 10,241,015 B2 | 3/2019 | Thorne et al. | |
| 11,605,524 B2 | 3/2023 | Closs et al. | |
| 11,653,644 B2 | 5/2023 | Thorne et al. | |
| 2010/0143198 A1 | 6/2010 | Damiano et al. | |
| 2012/0261588 A1 | 10/2012 | Wei | |
| 2014/0203191 A1* | 7/2014 | Buijsse | G01N 21/6458 |
| | | | 250/459.1 |
| 2016/0189919 A1 | 6/2016 | Passmore et al. | |
| 2021/0066032 A1 | 3/2021 | Kuijper et al. | |
| 2022/0146441 A1 | 5/2022 | Thorne et al. | |
| 2022/0291098 A1 | 9/2022 | Closs et al. | |
| 2022/0412635 A1 | 12/2022 | Closs et al. | |
| 2023/0255194 A1 | 8/2023 | Thorne et al. | |

OTHER PUBLICATIONS

"Grids including TEM Support Films, Grid Staining, & Grid Storage" pp. 1-55 (Mar. 20, 2017), retrieved on Sep. 18, 2023 from http://scienceservices.de/media/pdf/ScienceServices_EMS_Catalogue_Grids.pdf.
International Search Report for an International Application No. PCT/US22/032046, dated Sep. 1, 2022.

* cited by examiner

200

250

250

200

260

260

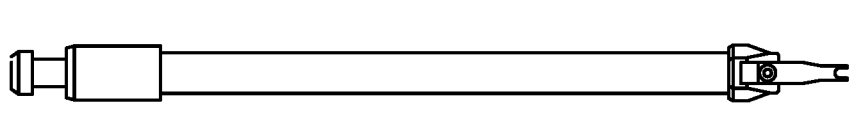
FIG. 9(C)
FIG. 9(B)
FIG. 9(A)
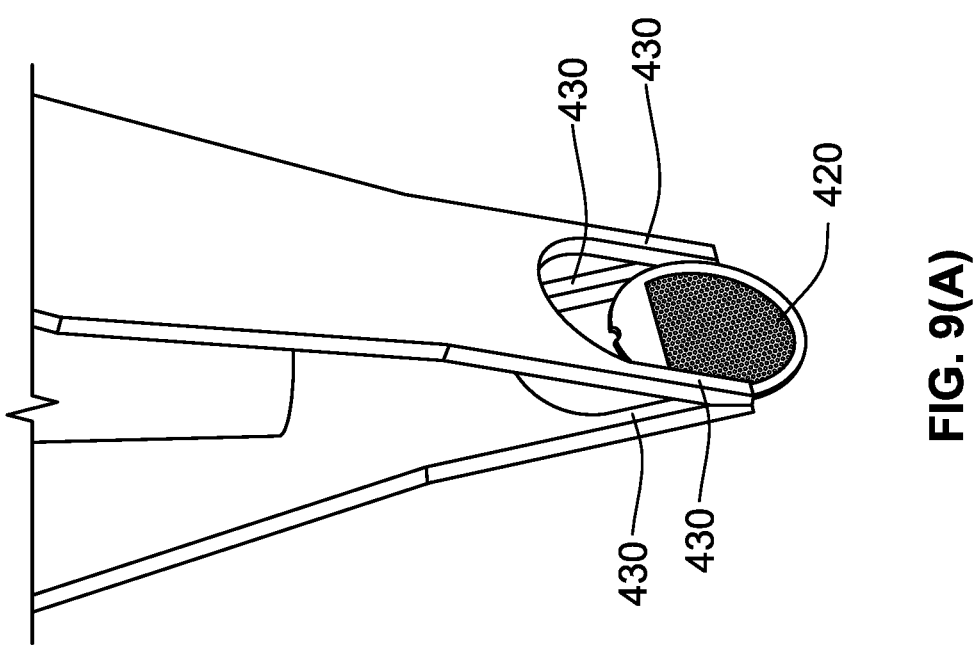

SAMPLE SUPPORTS FOR CRYO-ELECTRON MICROSCOPY

CLAIM OF PRIORITY AND CROSS-REFERENCE TO RELATED APPLICATIONS

This application is a U.S. National-Phase Entry of International Patent Application No. PCT/US2022/032046, which was filed on Jun. 3, 2022, and claims priority to U.S. Provisional Patent Application No. 63/197,077, which was filed Jun. 4, 2021. Both of the foregoing patent applications are incorporated herein by reference in their respective entireties and for all purposes.

STATEMENT REGARDING FEDERALLY SPONSORED RESEARCH AND DEVELOPMENT

This invention was made with United States Government support under award number R43 GM137720-01 by the U.S. National Institute of Health (NIH), National Institute of General Medical Sciences (NIGMS). The U.S. Government may have certain rights in the invention.

BACKGROUND

The present disclosure related generally to the field of biotechnology. More particularly, aspects of this disclosure relate to sample supports and sample cooling systems for cryo-electron microscopy.

Single-particle cryo-electron microscopy (cryo-EM) is a powerful approach to obtaining near-atomic-resolution structures of large biomolecular complexes, membrane proteins, and other targets of major scientific, pharmaceutical, and biotechnological interest. Development of high efficiency, high frame rate direct electron detectors, algorithms for correcting acquired "movies" for electron-beam-induced motion, and computational tools for classifying and averaging $10^5$-$10^6$ molecular images have dramatically increased achievable resolution and throughput. Enormous investments in new cryo-EM facilities and the development of easy-to-use software have greatly expanded access, especially to non-experts. Unlike X-ray crystallography, cryo-EM requires only a small amount of biomolecular sample dispersed in solution. It allows structural study of systems that have been intractable to crystallization, and is becoming a go-to method for initial attempts at structure determination.

As in X-ray cryocrystallography, key challenges in single-particle cryo-EM are associated with sample preparation and handling. Basic principles and methods in current use were developed in the 1980s, and recent sample preparation technology development is firmly rooted in ideas and methods developed at that time. Historically, biomolecule samples are expressed, isolated, and purified. Cryoprotectant-free buffer containing ~0.3 mg/ml of the biomolecule of interest is dispensed onto glow-discharge cleaned and charged, 10-50 nm thick carbon or metal (often gold) "foil" supported by a 200-400 mesh, 10-25 μm thick, 3 mm diameter metal (usually copper or gold) grid. Excess sample is removed by blotting and evaporation, with a target thickness of several times the biomolecular diameter or ~10-50 nm to maximize image quality while limiting the fraction of biomolecules preferentially oriented by interaction with interfaces. To vitrify the buffer for the best imaging, the sample-containing foil-and-grid assembly is plunged at 1-2 m/s into liquid ethane at T~90 K (produced by cooling gas in a liquid-nitrogen-cooled cup). The sample is transferred from ethane to liquid nitrogen (LN2), loaded into grid boxes, transferred to additional containers, and then to a storage Dewar. Samples are removed from the storage Dewar and grid boxes, and then loaded into a cold microscope stage or else "clipped" and loaded into a cold sample cassette: the stage or cassette is then loaded in the microscope.

These complex procedures are fraught with difficulty. Grids and especially foils are routinely bent, torn, and otherwise damaged at each of the many manual handling steps. Sample dispensing, blotting, and evaporation are oftentimes imprecise processes. Final sample film thicknesses may be poorly controlled. Biomolecules accumulate at interfaces where they may have preferential orientation or undergo denaturation. Plunge cooled samples often develop significant crystalline ice, and are contaminated by ice that forms on the ethane, nitrogen, and other cold surfaces exposed to moisture. When first irradiated by the electron beam during imaging, the vitrified samples undergo rapid motion that blurs the images and causes large loss of information.

SUMMARY

Aspects of the present disclosure relate to systems, methods and devices that use sample supports and sample cooling devices for cryo-electron microscopy. Described herein, for example, are innovations in sample support design and sample cooling devices. These innovations should help to reduce electron beam-induced sample motion, a key factor limiting the achievable resolution in cryo-EM, and increase achievable sample cooling rates. Disclosed features also help to facilitate more controlled sample preparation and cooling and automated storage of grids after plunge cooling in grid boxes.

At least some of the disclosed sample supports for cryo-EM are comprised of a metal grid with a diameter of about 2.5 to about 3.5 mm or, in some configurations, about 3.05 mm, a thickness of about 10 micrometers (μm) to about 25 μm, and may be covered on a top surface by a markedly thinner (e.g., about 10 to about 50 nanometers) sample support film/foil of carbon or metal. In at least some configurations, the grid may have a mesh pattern with about 200-400 mesh corresponding to a pitch/repeat period of between about 50 and 150 μm or, in at least some implementations, of between about 62 and 125 μm, and with through-holes with diameters/widths of between about 20 and 130 μm or, in at least some implementations, of between about 37 and 106 μm. The grid may also have a solid, aperture-free outer edge region. The foil may have a pattern of much smaller through holes, typically between about 0.2 and about 2 micrometers. Prior designs are handled with metal tweezers with pointed tips, and are often damaged in their handling.

Described herein is a series of innovations to grids and foils that will help to improve functionality and useful throughput.

According to aspects of the disclosed concepts, a grid beneath a sample support film may have substantial areas—together comprising at least 10% and less than 50% of the grid area—on two diametrically opposing sides where it is solid or nearly solid, to provide an area where the grid can be safely gripped on both sides, rather than at a single point using forceps.

According to aspects of the disclosed concepts, the sample support film or foil may be sized and shaped so that it does not substantially overlap the solid, gripping portions of a configuration of the grid having a solid, gripping portion on both sides, so that the grid may be gripped on the solid area without contacting or damaging the foil.

According to aspects of the disclosed concepts, the grid may have one or more interior areas that may be mechanically isolated from the surrounding grid area, e.g., to reduce stress and deformation of the interior area due to differences in contraction of the interior area and surrounding area during cooling, where these differences in contraction may arise from differences in temperature during cooling.

According to aspects of the disclosed concepts, in at least one interior area of the grid, the width and/or thickness of grid bars is reduced, and/or the grid open area fraction is increased, e.g., to reduce the total thermal mass per unit area of the grid and increase its cooling rate.

According to aspects of the disclosed concepts, at least one interior area of the grid may be connected to the surrounding area by bars that are tangent to the periphery of the interior area and that are connected to the surrounding area only at their ends, e.g., so that these bars deflect sideways at their point of contact to the interior area when the interior area and surrounding area are at different temperatures and have contracted by different amounts.

According to aspects of the disclosed concepts, the interior area of the grid may be connected to each tangential bar via a small tab running perpendicular to the bar's axis.

According to aspects of the disclosed concepts, the interior area of the grid may be connected to the surrounding area via zig-zag or squiggly spring-shaped metal members, e.g., that undergo deformation relative to the inner and surrounding areas when the grid is placed under stress.

Aspects of the present disclosure further relate to foils that reside on the grids and to improvements to those foils, e.g., to reduce beam-induced sample motion.

According to aspects of the disclosed concepts, the foil may rests on a grid and may have one or more interior areas that are mechanically isolated from the surrounding grid area, e.g., to reduce stress and deformation of the interior area when the outer area is under stress, as may occur when the grid bars to which the outer area is attached cool more slowly than does the foil in the inner area.

According to aspects of the disclosed concepts, one or more of the foil interior areas may be connected to the surrounding area by bars that are tangent to the periphery of the interior area and that are connected to the surrounding area only at their ends, e.g., so that these bars deflect sideways at their point of contact to the interior area when the interior area and surrounding area are at different temperatures and have contracted by different amounts.

According to aspects of the disclosed concepts, the interior area may be connected to each tangential bar via a small tab running perpendicular to the bar's axis.

According to aspects of the disclosed concepts, the interior area of the foil is connected to the surrounding area via zig-zag or squiggly spring-shaped metal tabs that preferentially undergo deformation relative to the inner and surrounding areas when the grid is placed under stress.

According to aspects of the disclosed concepts, the foil that rests on the grid may have interior areas that have a pattern of slits or apertures, e.g., that allow release of stress when the foil is placed under tensile stress, so that some regions of the foil within these interior areas remain nearly stress free, while stress is concentrated in other areas.

According to aspects of the disclosed concepts, the slits on the foil may be arranged in a pattern that defines rectangular areas: these slits may be designed to open up when the foil is placed under tensile stress, reducing stress in the interior area bounded by the slits.

According to aspects of the disclosed concepts, the slits on the foil may be arranged in a pattern that defines rectangular areas. When the foil is placed under tensile stress, the slits open up, and their pattern of opening is such that the rectangular area rotates but remains largely stress free, with stress concentration occurring in "hinge" regions between the slits.

According to aspects of the disclosed concepts, the slits in the foil may be arranged to define other auxetic patterns including rotating parallelograms, rotating squares of different sizes, and rotating triangles, each of which can expand when placed under tensile stress in a way that involves rotation of nearly stress-free elements and stress concentration in links between elements.

According to aspects of the disclosed concepts, regions of foil with stress-relieving features may form a checkerboard like pattern across the area of a grid, so that some areas of the foil have standard hole patterns and retain full mechanical strength, while other areas have stress relieving features, so as to make the foil more robust during handling and grid assembly.

According to aspects of the disclosed concepts, the foil that covers the grid may have regions with at least two different thicknesses, and one or more of these regions may have an array of through-holes.

According to aspects of the disclosed concepts, these regions of two different thicknesses may be generated by evaporating metal onto a master, then sprinkling particles of a narrow size range on it, then evaporating again, then removing the particles. The particles are much larger than the hole spacing but smaller than a few grid squares.

Aspects of the present disclosure further disclose designs for tools, such as forceps, for holding cryo-EM grids in a plunge cooling device.

According to aspects of the disclosed concepts, the tool may include or may consist essentially of a wand with a push-button actuator at one end, and a pair of grid-gripping jaws that are actuated by the push button at the other end. According to aspects of the disclosed concepts, the jaws may have projections that squeeze together to grab opposing edges of the grid while leaving the majority of the grid accessible for sample deposition and blotting.

According to aspects of the disclosed concepts, the jaws of the tool may leave large free areas above and below the grid that are not obstructed by the gripper to facilitate blotting.

According to aspects of the disclosed concepts, the jaws may be of a low thermal conductivity material like stainless steel or a polymer like Teflon. In an example, the jaws are made as thin and narrow as possible to minimize the total thermal mass in contact with the grid. According to aspects of the disclosed concepts, the jaws may have a textured surface to minimize the area of direct contact with the grid and improve grid gripping.

Aspects of the present disclosure also present systems, devices, and means for automatically capturing and storing cryo-EM grids after plunge cooling in grid boxes. In an example, a motor-driven mechanical stage within the main liquid nitrogen chamber accepts standard cryo-EM sample holder storage boxes/cassettes and automatically positions them in line with the sample plunge path defined by the vertical translation stage, e.g., so that each cold sample may be deposited into a separate compartment in each holder through a combination of vertical-only motion of the vertical translation stage and horizontal-only linear or circular motion of the mechanical stage on which the sample holder storage boxes are placed.

According to aspects of the disclosed concepts, a representative system, device or means may comprise a vertical linear sample translation stage that may plunge a sample at a speed of between 1 and 10 m/s into liquid nitrogen, and then translate it downward along the same axis. A grid gripping mechanism is attached to this stage and can grip a cryo-EM grid and hold its plane precisely perpendicular to the surface of the liquid nitrogen, and can release the grid after cooling. In addition, a Dewar or insulated container is employed to contain a cryogenic fluid, such as liquid nitrogen. A stage with one degree of freedom, which can be either translational or rotational, operates in the liquid cryogen in the insulated container. A platform may be attached to this stage and holds one or more grid boxes in a well-defined orientation. A motor and control system may automatically translate/rotate the stage to bring successive grid slots in each grid box into alignment with the axis of the vertical translation stage, so that a grid may be released into it.

According to aspects of the disclosed concepts, a funnel device may be positioned at the end of the plunge path of the vertical translation stage within the liquid nitrogen and immediately above the top of the grid box platform to guide the grids into the grid boxes.

According to aspects of the disclosed concepts, the gripping mechanism may automatically release a cryo-EM grid into a storage container after the grid has been plunge-cooled.

The above Summary does not represent every embodiment or every aspect of the present disclosure. Rather, the foregoing synopsis merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

BRIEF DESCRIPTION OF THE DRAWINGS

FIG. 9 (FIGS. 9(A)-9(C)) shows a representative wand with side-gripping forceps for gripping a grid and holding it in a vertical translation stage of a plunge cooler in accord with aspects of the disclosed concepts.

Figure 1:
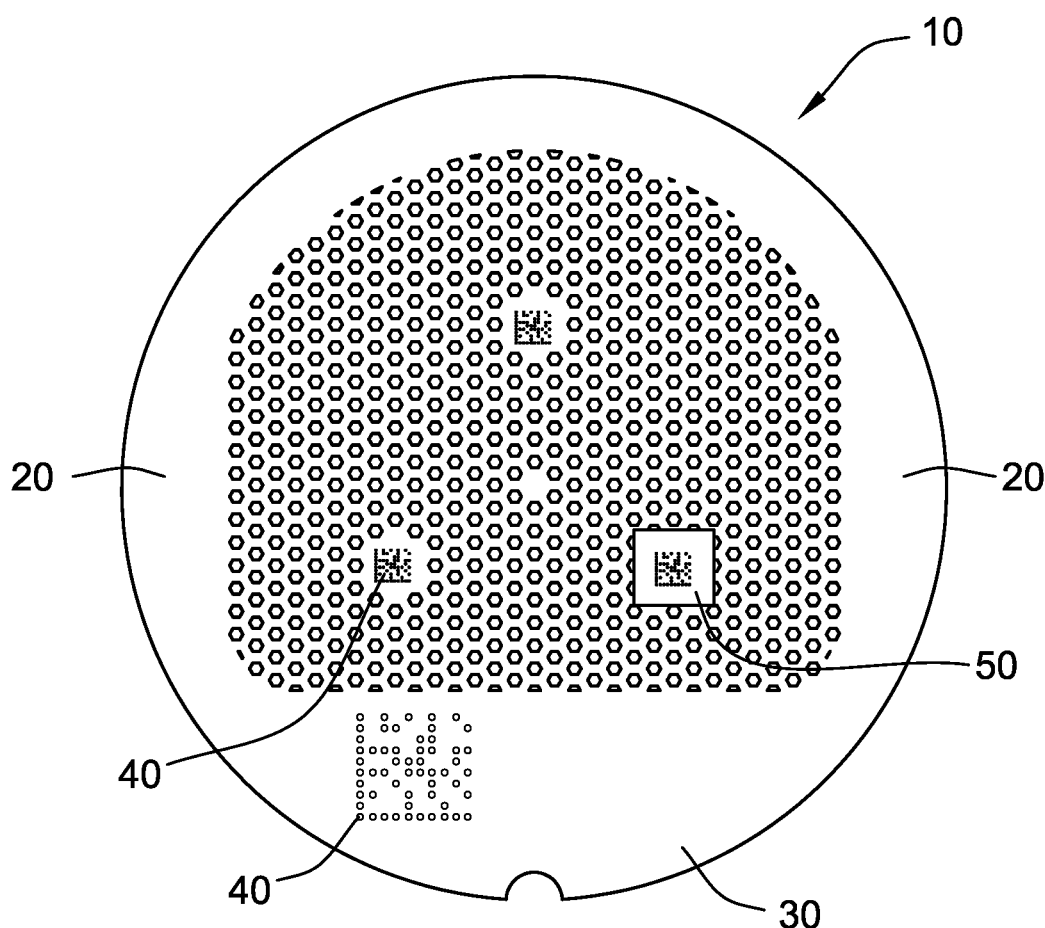
FIG. 1 is a top-view illustration of a representative cryo-EM grid with solid holeless regions on opposite sides thereof for gripping in accord with aspects of the disclosed concepts.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, this disclosure covers all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative embodiments of the disclosure are shown in the drawings and will herein be described in detail with the understanding that these embodiments are provided as exemplifications of the disclosed principles, not limitations of the broad aspects of the disclosure. To that extent, elements and limitations that are described, for example, in the Abstract, Introduction, Summary, Brief Description of the Drawings, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa: the words "and" and "or" shall be both conjunctive and disjunctive; the words "any" and "all" shall both mean "any and all": and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example.

Goals of at least some of the disclosed concepts include developing tools, including sample supports, sample handling tools, and cooling instruments, that enable reliable vitrification of cryo-EM samples, reduce rates of grid and foil damage, and facilitate automated sample tracking, as some non-limiting examples.

Scientific Motivation

The current generation of cryo-EM sample supports and cooling devices are based in large part upon research and principles developed in the 1980s. Some key issues addressed by the present disclosure are described below.

Methods for holding grids during plunge cooling are inadequate. Grids are typically held using forceps that grip the top center of the grid, and is not supported in any way from the back side. During liquid deposition and blotting, the grid easily deflects, making precise blotting more difficult, and can become permanently bent. When the grid is plunged at a high speed into a liquid cryogen, any slight deviation from verticality can cause the grid to bend dramatically as it enters and moves through the liquid cryogen. This adversely affects grid cooling and can lead to damage of foil and grid.

Beam induced motion, a critical factor limiting achievable resolution in single-particle cryo-EM, most likely arises from large temperature differences between grid bars and the sample+foil during cooling. Sample motion during irradiation is a major factor limiting resolution in single-particle cryo-EM. Motion occurs even during low-dose exposures, and is most rapid (on a per dose basis) at the beginning of irradiation, when radiation damage is modest and the highest-resolution structural information is available. If sufficient signal to noise is available, "movies" of the sample can be analyzed to correct for this motion to improve final resolution. Bare sample foils undergo substantial beam-induced motion (BIM), due to stress and buckling associated with differential contraction during cooling of the foil and grid materials, and this motion is minimized by using the same material (e.g., Au) for both. For biomolecule-containing samples within the foil's holes, particle tracking experiments suggest the primary mode of motion corresponds to "doming" of the sample film (like a drum-head): for 1.2 μm diameter holes, the radiation-induced displacement of the sample perpendicular to the foil's plane foil was ~150 Å, with a curvature radius of 25 μm. This doming motion indicates that samples within the holes are under substantial compressive stress.

Observed decay of sample motion with increasing electron dose indicates that motion primarily arises from radiation-induced creep driven by sample stress: as creep proceeds, the driving stress is released and thus the creep rate drops. Recent experiments found that BIM was reduced by a factor of 4 when samples were briefly warmed to ~150-170 K, above the devitrification temperature where diffusive water motion allows sample stress to be released. But where does the initial sample stress come from?

Sample stress can be generated by differential contraction of the sample and foil support during cooling. Between room temperature and water's glass transition temperature $T_g$~136

K, the sample undergoes a net volume expansion of ~8%, but since the sample remains liquid (assuming it does not crystallize) this expansion is essentially uncoupled from the contraction of the support foil (contrary to claims in Ref. 37)." Below $T_g$, vitrified water has a positive thermal expansion coefficient (comparable to that of hexagonal ice), but sample contraction is now strongly coupled to that of the supporting foil. Cooling-induced sample stress can then be reduced by matching the expansion coefficients of vitreous ice and the foil between $T_g$ and 77 K, the final storage temperature. Amorphous carbon, Cu, and Au foils all contract less than vitreous ice in this temperature range (with Au providing the best match). All will likely produce tensile stress in the sample. However, radiation-induced creep in the presence of tensile sample stress will not cause observed doming.

It has been shown that the dominant source of stress driving radiation-induced sample motion is connected to substantial transient temperature differences between the grid bars and the sample+foil that occur during cooling. Because the foil is so much thinner and less mechanically stiff than the grid bars, its length (and area) contraction will largely be determined by the contraction of the grid bars. Since the grid bars cool and thus contract more slowly than the foil between them, the foil will develop transient tension (even if it is of the same material as the grid bars). The sample then vitrifies on (and becomes rigidly attached to) this tensile-stressed foil. As the grid bars cool toward the final temperature of the foil+sample, their separation decreases and the tension in the foil is released. But this now places the sample under compressive stress. In the foil holes where the sample is unconstrained by the foil in its relaxation, irradiation-induced creep will then generate "doming" to release this stress. Calculations have shown that the observed "doming" of height ~150 Å in a 1.2 μm foil hole could be generated by a temperature difference between grid bars and foil at the time of sample vitrification of as little as 20 K. Recent experiments confirm a prediction that BIM should scale linearly with foil hole diameter. Molecular diffusion and devitrification that occur on warming to 150-170 Kelvin (K) release this stress, and recooling to 77 K does not restore it because the sample remains largely solid and because the size of transient temperature and thermal contraction differences between foil and grid are much smaller.

Two other sources of grid-related sample stress contribute to non-doming components of beam-induced sample motion. First, damaged or improperly "tweezed" grids/foils may undergo significant bending once they enter the ethane, generating stress in the vitrified sample film if the bend radius is small enough. Second, with cooling rates of ~$10^5$ K/s to $10^6$ K/s and plunge speeds of 2 m/s, grid and foil cooling as they enter the liquid cryogen occurs in a band ~3 or 0.3 mm, respectively, along the plunge direction. Within this band the grid and foil have large transient temperature gradients, causing transient gradients in grid spacing that create transient stress in the foil. Relaxation of these transient grid deformations after the sample has vitrified will create directional stress in the foil+sample.

DESCRIPTION OF ILLUSTRATED EXAMPLES

FIG. 1 shows a cryo-EM grid (10) with two solid, aperture-free gripping regions (20) on opposing left and right sides thereof, e.g., for gripping with parallel "jaws". A grid gripped in this way, for example, will be rigid during sample deposition and blotting and will not flex and bend during plunge cooling. The gripping regions may have a width of about 200 to about 600 micrometers in a radial direction and, for at least some implementations, about 400 micrometers. Generally speaking, the gripping regions may be wide enough for sufficient gripping but not so wide as to obstruct access to and excessively reduce cooling of the rest of the grid. The representative design in FIG. 1 also has a third solid, aperture-free gripping region (30) along a side thereof that connects the left and right sides of the grid (1). This third gripping region (30) may be used for gripping using the forceps of a plunge cooler. Marked patterns (40) may uniquely identify each grid, and a thin graphene or graphite foil (50) may cover one or more of the marked patterns for microscope calibration.

Figures 2A, 2B, 2C, 2D:
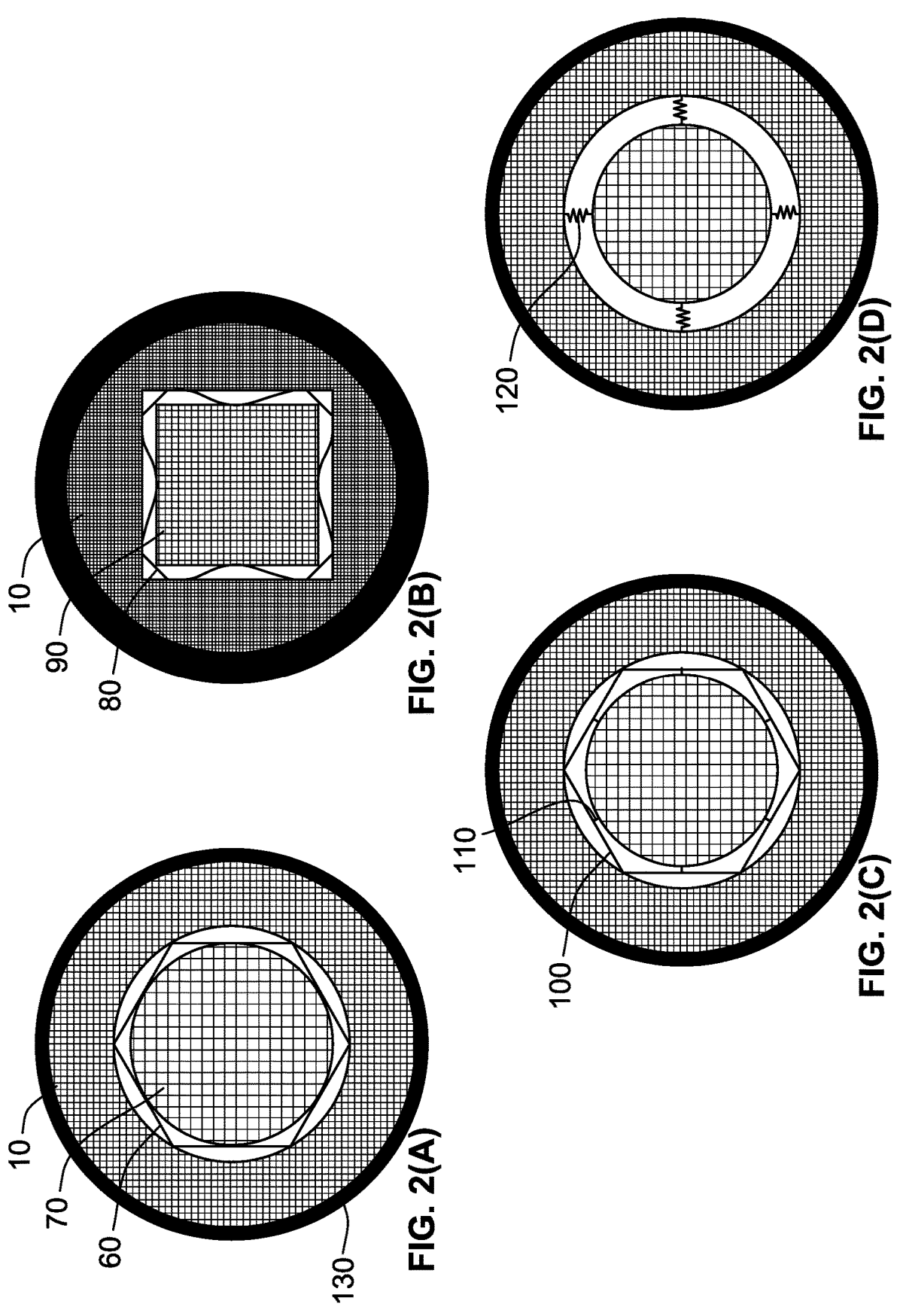
FIG. 2 (FIGS. 2(A)-2(D)) shows representative grid designs that mechanically isolate an interior grid region from a surrounding grid region in accord with aspects of the disclosed concepts.

FIG. 2 shows several grid designs that help to mechanically and thermally isolate an interior region of the grid (e.g., a circular or square, radial center region) from a surrounding region (e.g., an annular, radial outer region). The interior region may be thinner, have narrower grid bars, a different grid bar spacing, etc. from the surrounding region. The designs in FIGS. 2A, 2B and 2C are shown with "tangential beams"—bars that run tangent to the inner region and are connected at their ends to the outer region. If the inner region is colder than the surrounding region, for example, it will likely contract more than the surrounding region. The "tangential beams" have limited stiffness to bending perpendicular to their axis and, thus, allow this contraction to occur while concomitantly reducing stress that would otherwise develop in the inner region. If the inner region cools faster during plunge cooling than the surrounding region, this will reduce transient stresses that develop and reduce associated beam induced motion.

In FIG. 2(A), the bars/beams (60) are rectilinear structures that are tangent to and attach directly to the outer periphery of a circular inner region (70). The bars (60) of FIG. 2(A) may form a one-piece structure that extends continuously around and surrounds the inner region (70) and, as shown, forms a hexagonal structure. In FIG. 2(B), the beams (80) likewise may connect tangentially to and surround a rectangular inner region (90). These beams (80) may be bent, e.g., into a waveform shape, like leaf springs and may attach to the inner region (90) such that the inner region (90), when the beams (80) flex, is able to move transversely and axially with respect to a diametric center of the grid (10).

In FIG. 2(C), the beams (100) are tangent to yet spaced from the outer periphery of a circular inner region and are attached to the inner region via short tabs (110) that extend radially between the inner and outer regions. These tabs (110) may help to reduce the area of contact with the inner region. A width and/or length of the tabs (110) may be adjusted, for example, to ensure that the tabs do not fail under the stresses imparted thereto during cooling. In FIG. 2(D), the inner region is isolated from the outer region using multiple (four) discrete beams (120), each of which may be shaped like a compression-extension type, zig-zag spring member. Each beam (120) may be spaced circumferentially from its neighboring beams and extends radially between the inner and outer regions, joining an innermost peripheral edge of the outer region to an outermost peripheral edge of the inner region. For at least some configurations, all components of the grid are fabricated of the same material, using a method such as electroforming. Each grid may be formed as a unitary, single-piece structure. Alternatively, the grids may be formed as multipiece (e.g., bipartite or tripartite) structures with the constituent parts then physically joined together.

Other available options include the configuration of the through-holes on the inner region (70) of the grid may be distinct from (e.g., in shape, size, arrangement, etc.) or substantially identical to the configuration of the through-holes on the outer region. In FIG. 2(A) for example, both the inner and out regions include square-shaped through-holes that are arranged in a square array of rows and columns. However, the through-holes of the inner region (70) are 2×-3× the size (e.g., area, width, diameter, etc.) than the through-holes of the outer region. To that end, one or both regions may include through-holes with other shapes, as shown the circular holes in FIG. 4, which may be arranged in similar or distinct patterns, such as a lattice structure, a hexagonal structure, or staggered dispersion. Inner and outer peripheries of the outer region may each be delineated by a respective holeless rigid frame, as seen in FIG. 2(A) on the outer periphery (13), for example. When comparing FIG. 2(A) to FIG. 2(B), it can be seen that only the outer periphery of the outer region (and/or the outer periphery of the inner region) may be circumscribed by a holeless rigid frame.

Figure 3:
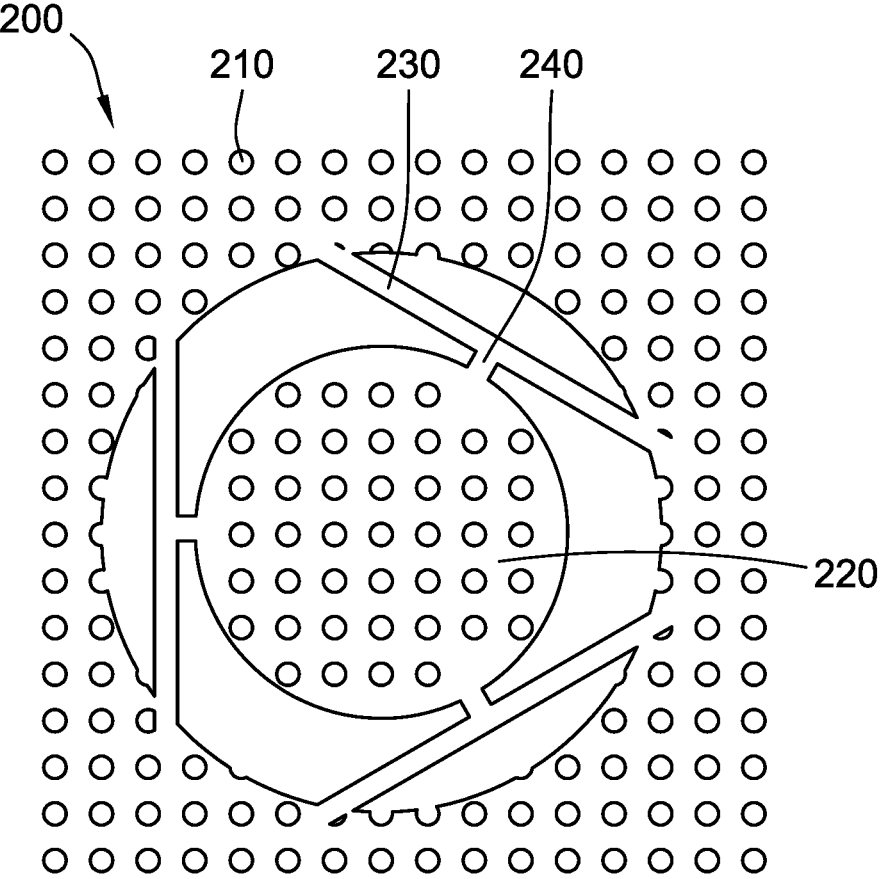
FIG. 3 shows a region of a representative foil within a grid opening having an interior foil region that is mechanically isolated from the surrounding foil region in accord with aspects of the disclosed concepts.

The same features and options shown in FIG. 2, e.g., to mechanically isolate an inner region of a grid from an outer region of that grid, may be used to isolate an inner portion of a hole-filled foil from an outer portion of the foil. For example, FIG. 3 shows a small portion of a "holey" foil (200), which may have a square or other polygonal plan-view profile. An inner portion (220) of the foil (200) is isolated from an outer portion via multiple (three) tangential beams (230) and multiple (three) radial tabs (240). It may be desirable that a total size of the inner portion (220) and accompanying support beams (230) should be smaller than a total size of an opening in the underlying grid (e.g., roughly 60 micrometers in a 300 mesh grid with an 85 micrometer repeat and 25 micrometer grid bars). During cooling, the foil near the center of the grid bar openings cools much faster than the grid bars, and this places the foil between the grid bars in tension, because the foil is rigidly attached to the grid bars. The structure shown in FIG. 3 may help to reduce the resulting tension in the inner region. When the grid finally reaches the final temperature of the foil and liquid cryogen, the tensile stress in the foil is released, causing beam-induced motion except in the inner region where the tensile stress was minimized.

Figure 4A:
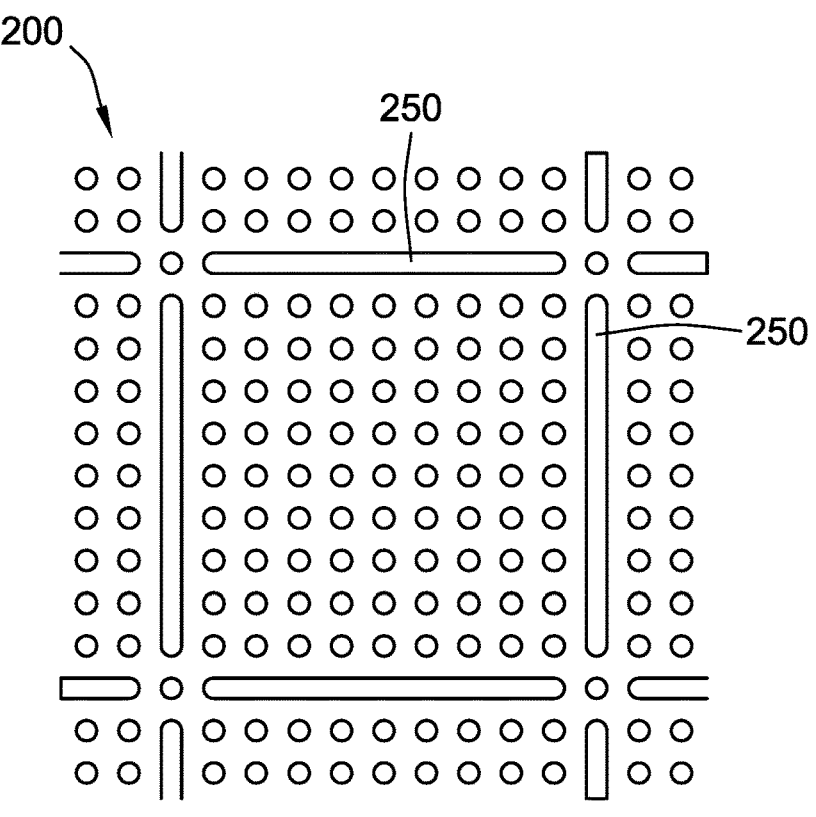
FIG. 4 (FIGS. 4(A) and 4(B)) shows a region of a representative foil with patterns of slits that enable the release of tensile stress so that foil regions bounded by the slits remain nearly stress free in accord with aspects of the disclosed concepts.
Figure 4B:
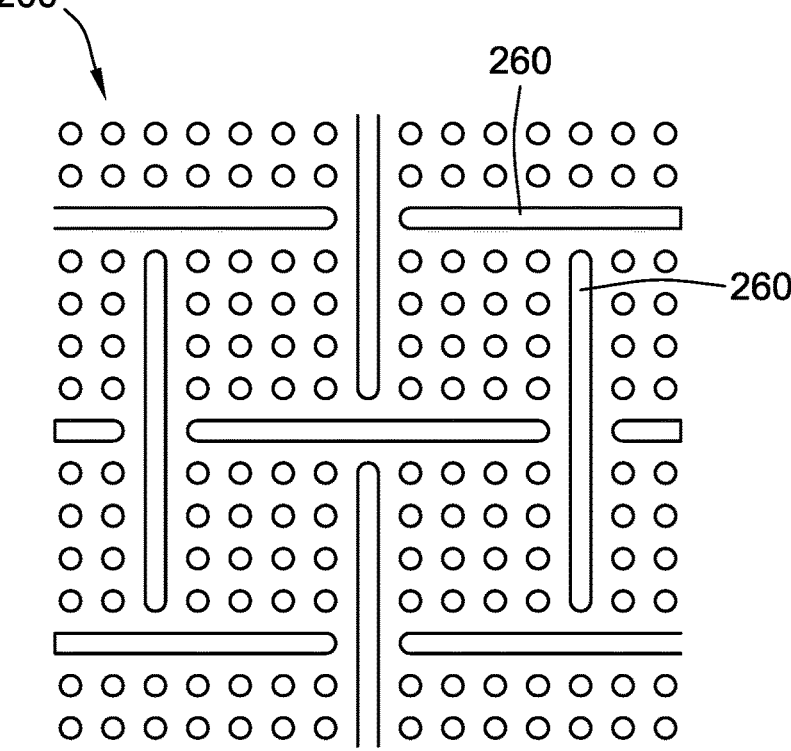

FIG. 4 shows two representative configurations that can be used, for example, to reduce transient tensile stress in the foil between grid bars. In FIG. 4(A), for example, a square array of elongated slits (250) are arranged in a foil (200) in mutually parallel rows that are perpendicular to mutually parallel columns. A single through-hole may be located at each nodal junction between four intersecting slits (250). When the foil (200) is placed under tensile stress, these slits (250) expand and, in so doing, reduce stress in the foil (200). In FIG. 4(B), the pattern of slits (260) takes on an auxetic configuration and may be adjusted to more effectively reduce tensile stress in the areas bounded by the slits. These slits (260) are also arranged in rows and columns; unlike FIG. 4(A), however, in FIG. 4(B) the slits (260) may be staggered with opposing ends of each slit (260) terminating in facing, spaced relation at a center-most section of neighboring slits (260).

Figure 5A:
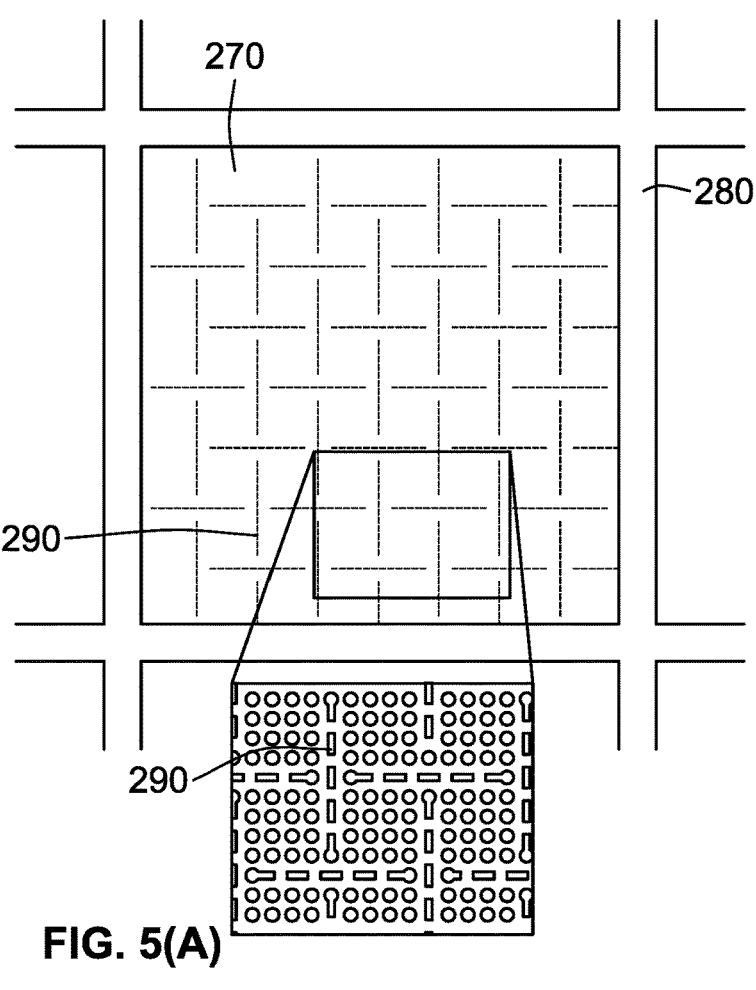
FIG. 5 (FIGS. 5(A) and 5(B)) shows how the representative foil design of FIG. 4(B) responds when the foil is placed under tensile stress.
Figure 5B:
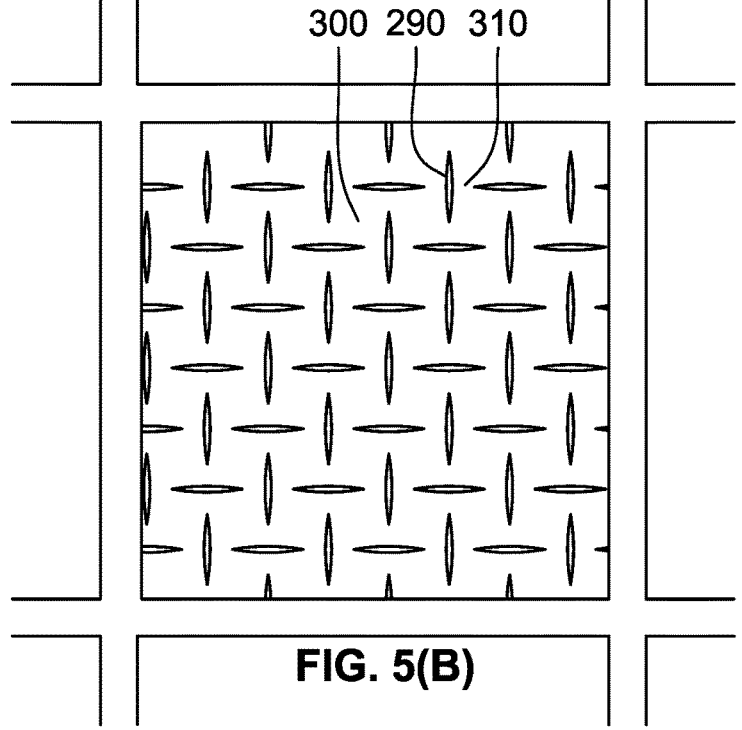

FIG. 5(A) shows a portion of a representative foil (270) located within a single grid opening defined by grid bars (280). A pattern of slits (290) as in FIG. 4(B), each of which may be a continuous slot (e.g., as in FIGS. 4(A) and 4(B)) or may be a series of linearly aligned mini-slots acting as frangible "weak" links (as shown) that connect the structural sides of the slit, are arranged in an auxetic pattern. FIG. 5(B) is an inset view showing a close up of a select section of the foil (270) to better see the through-holes in the foil (210) used for sample imaging. FIG. 5(C) shows how the foil (270) of FIG. 5(A), having the slit pattern of FIG. 4(A) may respond when it is colder than the surrounding grid bars, and therefore is under tensile stress that acts to stretch the foil. The slits (290) open up and the rectangular regions (300) defined by the slits rotate: in so doing, the rectangular regions (300) remain nearly stress free and stress is concentrated in the "hinge" regions (310). The total area filled by the (expanded and rotated) foil within each grid opening can remain equal to the area of the grid's opening, even though the foil's actual solid area is reduced by thermal contraction. During cooling, this will allow the sample to vitrify on the foil (270) that remains stress-free within the rectangular regions (300) even though there may be large temperature differences between grid and foil that create stresses that act to stretch the foil within each grid opening. Actual transient strains may be <0.1% or <0.1 μm within a grid opening and only tiny foil "openings" and rotations that won't affect step-and-repeat imaging in the TEM may be required. These patterns can be confined to the TEM-accessible region of a foil to preserve foil robustness during grid assembly. Alternatively, the patterns can be confined to smaller areas encompassing a few to several grid squares, which may be arranged in a "checkerboard" pattern with slit-free foil regions, e.g., to preserve foil robustness during lift-off and assembly onto the grid. The smaller areas could be comparable to or somewhat smaller than a single grid square (85 micrometers for a 300 mesh grid), or they can encompass several grid squares.

Figure 6B:
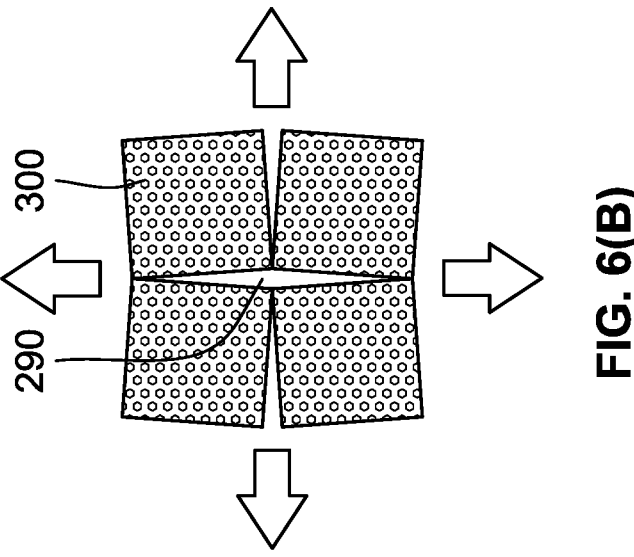
FIG. 6 (FIGS. 6(A) and 6(B)) shows another rendering of a foil region of a representative foil with patterns of slits on a rectangular grid as in FIG. 4(B) that enables the release of tensile stress so that rectangular foil regions bounded by the slits remain nearly stress-free.
Figure 6A:
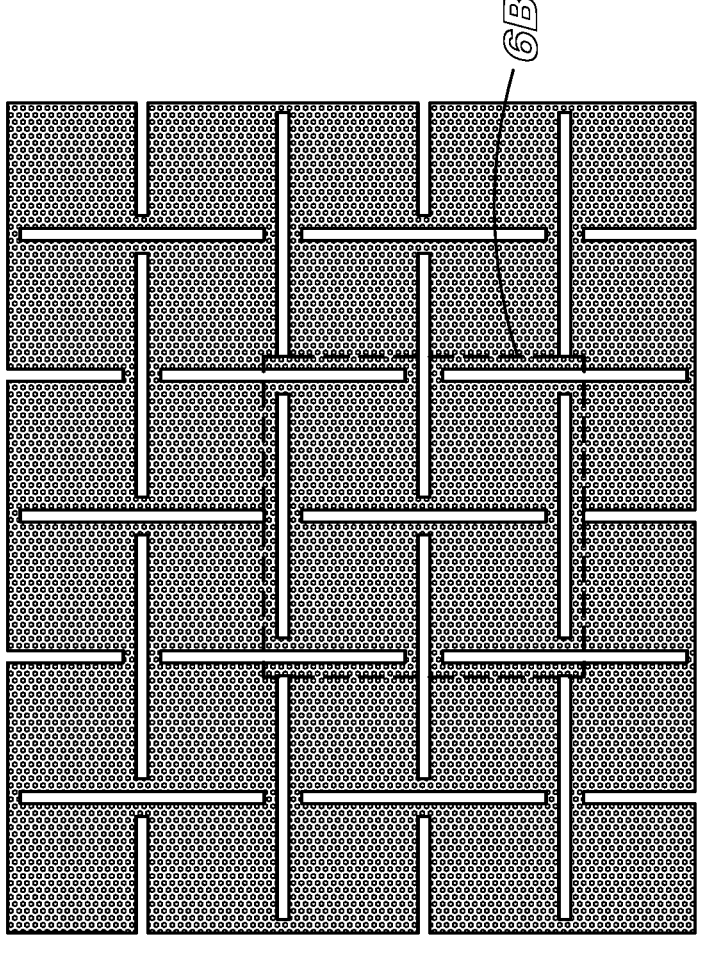

FIG. 6 is another rendering of another representative foil design with an arrangement of slits (290) similar to those in FIGS. 4(B) and 5, showing how the foils may respond to tensile stress via opening of the slits (290) and rotation of the rectangular regions (300).

According to the theory of auxetics (for example, see Grima and Evans, J. Mat. Sci. Lett. 19, 1563-1564 (2000), it is envisioned that a number of other slit patterns can be implemented to release stress in planar films by allowing rotation of nearly stress-free elements and stress concentration in small connecting areas. Any of these could be used for stress release in cryo-EM foils (or in cryo-EM grids having regions of different thickness, grid bar width, and/or grid bar density). These include slit patterns that define parallelograms, squares of two different sizes, triangles, etc.

Figure 7B:
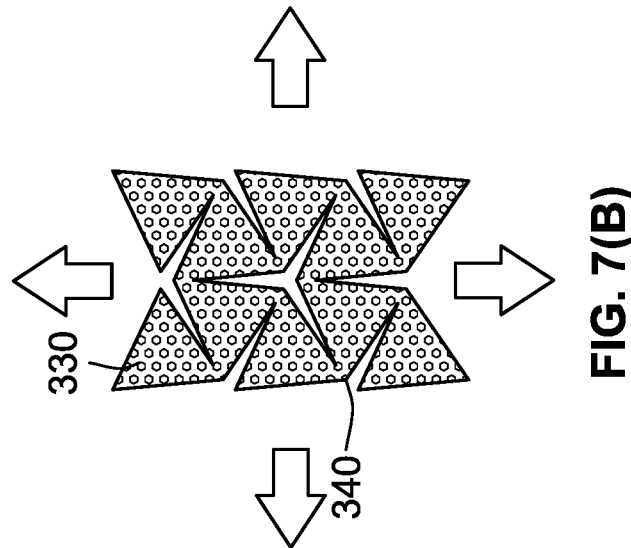
FIG. 7 (FIGS. 7(A) and 7(B)) shows another representative foil with a pattern of slits of a triangular grid that enables the release of tensile stress so that triangular foil regions bounded by the slits remain nearly stress-free in accord with aspects of the disclosed concepts.
Figure 7A:
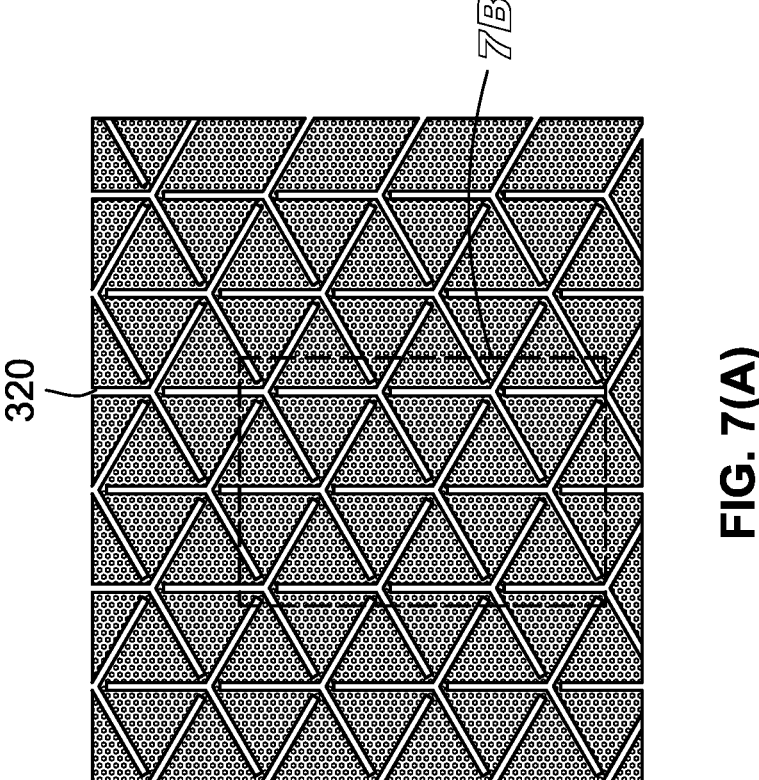

FIG. 7 shows an alternative foil design in which at least a portion of the foil has a triangular pattern of slits (320). In this case, triangular regions (330) defined by the slits (320) rotate when tensile stress is applied to the foil and remain largely stress free, with stress again being concentrated in hinge regions (340) that interconnect the adjoining regions (330).

Figure 8:
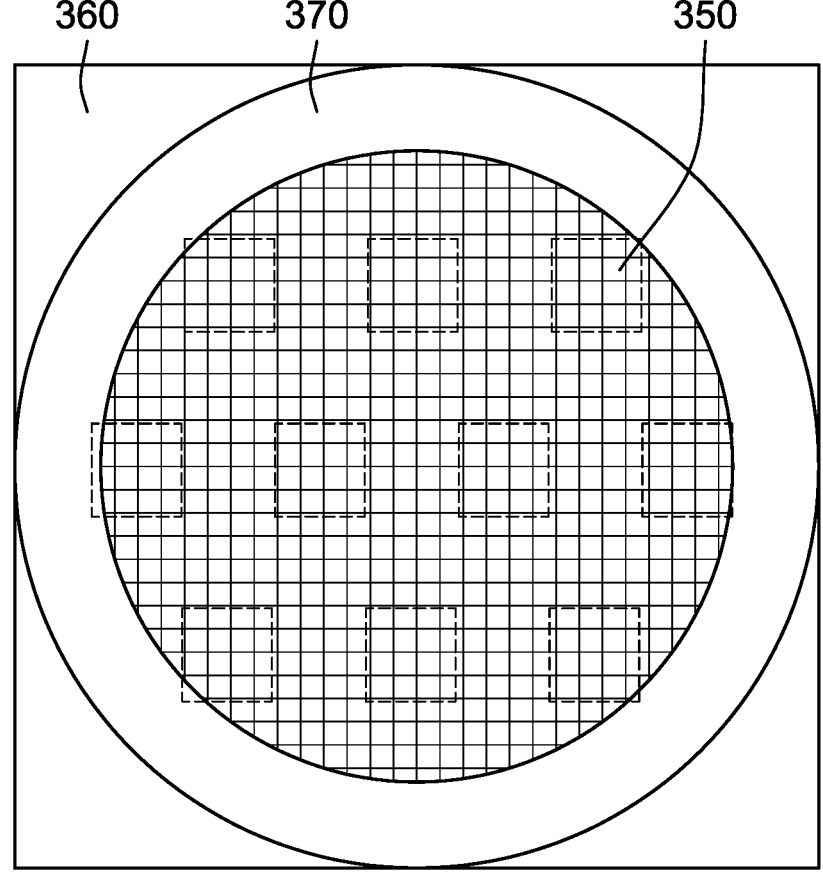
FIG. 8 shows a representative foil with areas of stress-relieving slits surrounded by "unslitted" foil areas over a cryo-EM grid in accord with aspects of the disclosed concepts.

FIG. 8 shows an example of how the slitted/stress relieved portions of the foil (indicated by dashed squares) (350) may be laid out over the area of foil (360) that is used for a standard 3.05 mm cryo-EM grid (370). In FIG. 8, the view is from the grid side of the grid-foil assembly. The presence of slits may weaken the foil and make it more prone to tearing during lift off from the master, floating onto the grid, and during plunge cooling. Since only small areas of the grid/foil are needed to obtain a complete single particle cryo-EM data set, the stress-relieving pattern can be confined to small areas encompassing several grid squares and be surrounded by "unslitted" foil (i.e., foil structure lacking slits, through-holes, cavities, etc.), e.g., to increase the foil's overall robustness.

Variable thickness foils. Foil thickness is, together with foil hole size, an important geometric parameter of a grid-and-foil assembly (grid+foil) in determining a final sample film thickness and, thus, whether imaging is feasible. Ideally, blotting and evaporation remove nearly all liquid except that within the holes. Explored herein are the feasibility and performance of foils that have a variable thickness across the TEM-accessible grid area. For at least some implementations, the simplest approach is to evaporate a base foil layer and then use a mechanical mask (e.g., fabricated from Ni or polyimide sheet) to shadow parts of the foil, small enough so as not to compromise overall foil mechanical properties, during a second evaporation step.

The foil that covers the grid can be fabricated with regions having two or more different thicknesses, where one or more of these regions has an array of through-holes. The hole thickness may determine an ice thickness when the sample has been properly blotted. Having two thicknesses on the same foil may help to increase the chance of obtaining an optimal sample thickness for imaging. The outer periphery of the foil can be made substantially thicker than the rest to simplify foil handling and placement on the grid. A foil with thickness that steps up at increasing radii could be fabricated by using disk-shaped shadow masks of increasing radius during successive depositions of metal or carbon. The innermost foil region would then be thinnest, and the outer periphery thickest. The shadow masks could be fabricated using standard photolithographic and etching processes from, e.g., 1 mil thick Cu foil, or from a photo-exposable polymer like SU-8 or polyimide. The disks for a foil array may be connected by thin lines. Shadowing by these lines can be reduced by using different line positions on successive masks, or by placing the mask in near contact and depositing the metal or carbon from an angle.

Tools for handling grids. FIG. 9 shows an example of a sample wand (400) with push-button actuation (410) for gripping grids (420) and holding them in a vertical translation stage during plunge cooling. FIG. 9(A) shows the gripping jaws (430) that hold the grid on its edges. The angle of the two jaws is exaggerated in the Figure, and should be small—preferably less than roughly 15 degrees, to minimize the impact cross section of the jaws when they enter the liquid cryogen. The surfaces of the jaws that contact the grid can be textured to reduce the area of physical and thermal contact with the grid. The jaws can be of any rigid material including stainless steel. FIG. 9(B) and FIG. 9(C) show to views of the sample wand. The jaws are opened using the push-button via a rod that moves downward and pushes the jaws apart.

Figure 10C:
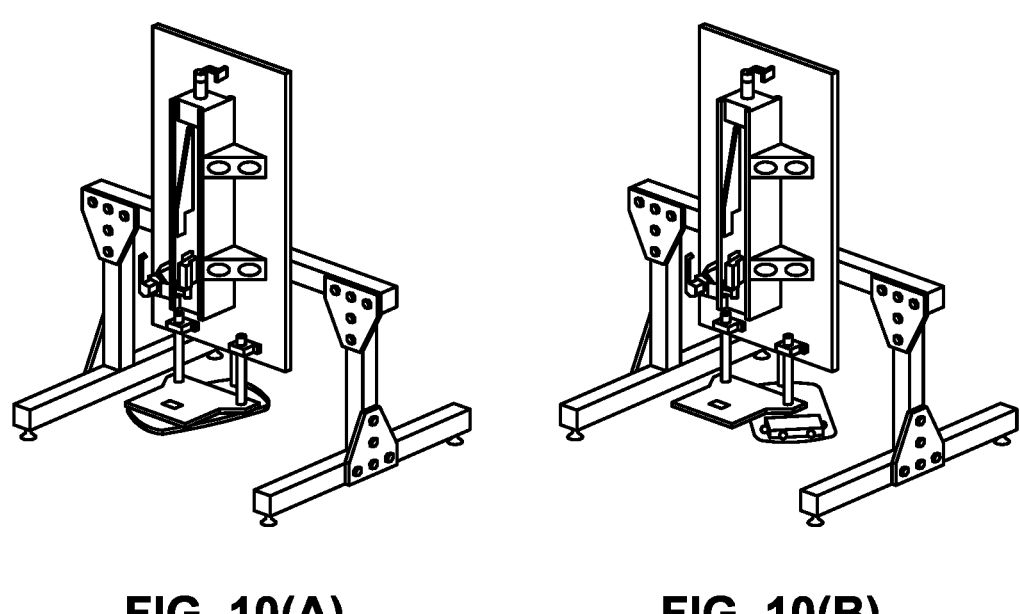
FIG. 10 (FIGS. 10(A)-10(C)) shows a representative vertical translation stage, a grid guiding member or funnel plate, and a horizontal stage that enable grids to be deposited into a series of slots in a sample holder platform-attached to the horizontal stage after plunge cooling in accord with aspects of the disclosed concepts.
Figure 10C:
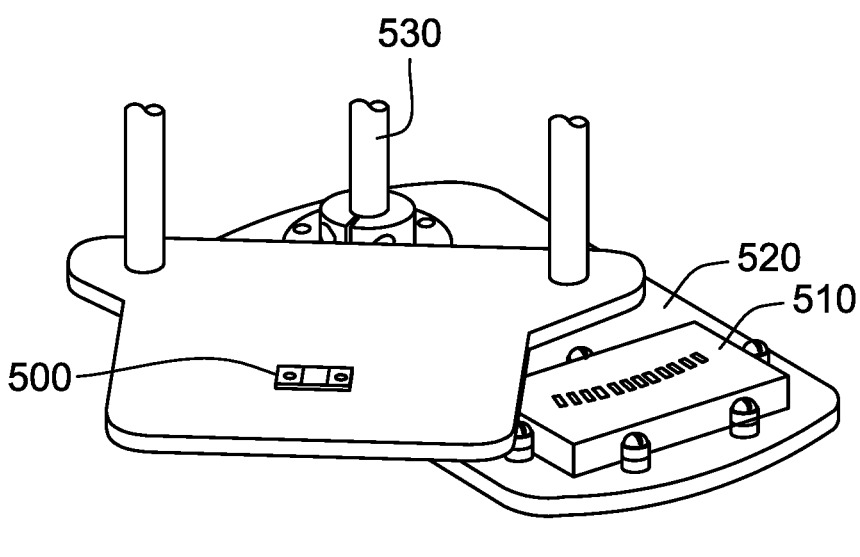

Automated storage of grids after plunge cooling. All plunge coolers have a vertical translation stage (driven or gravity drop) that translates the grids into the liquid cryogen. FIG. 10 shows part of a design for a plunge cooler including a system to automatically store the cold grids after plunging. The grid is held by a wand as in FIG. 9 that attaches to the vertical translation stage, and is translated downward, first, at high speed into the liquid cryogen, and then slowly to the grid release point. The grid is released by a mechanism that pushes on the push button of the wand, and falls into the grid capture system. The grid capture system, which resides in an insulated container of liquid nitrogen or other liquid cryogen (not shown) consists of a fixed "funnel" (500) that helps guide grids into storage slots, a storage platform (510) into which the grids are deposited, and a motorized stage (520)

on which the platform rests, that rotates or translates the platform with a single degree of freedom to position successive grid storage slots below the funnel. In FIG. 10, stage rotation is driven by the shaft 530 that connects to a motor. FIG. 10(A) shows the platform and stage in position for capturing a grid, and FIG. 10(B) shows the platform and stage rotated to allow removal and storage of the grid-containing platform. FIG. 10(C) shows a closeup of the funnel, the platform with grid slots, and the motorized stage.

Figure 11:
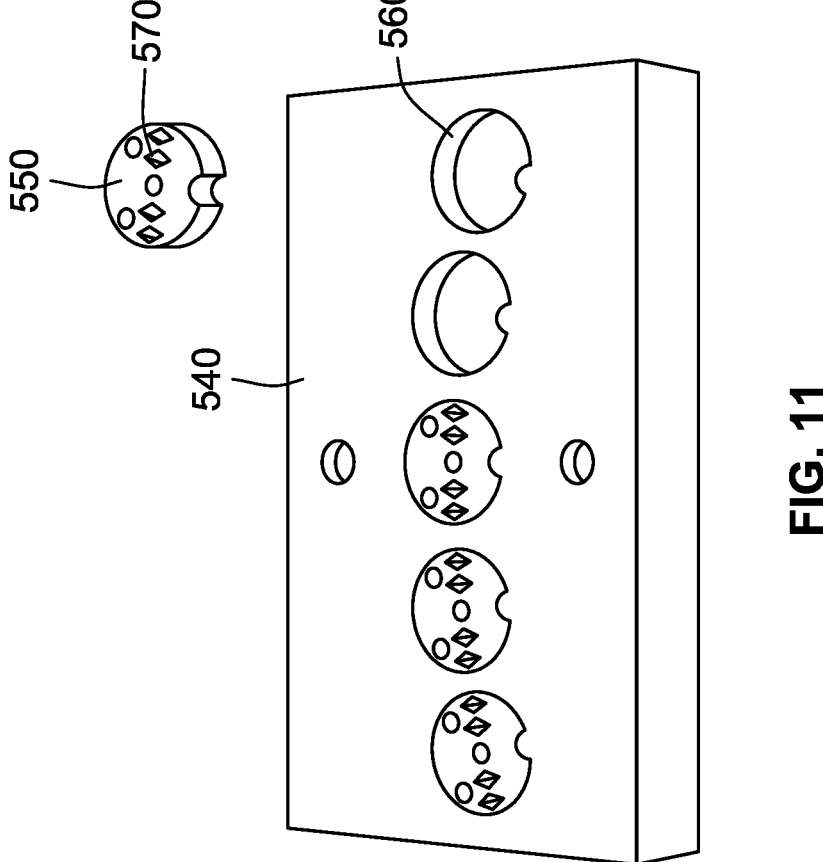
FIG. 11 shows an alternative sample holder platform that accepts grid boxes and holds them in a desired orientation for depositing grids after plunge cooling in accord with aspects of the disclosed concepts.

FIG. 11 shows an alternative platform (540) that accepts standard format cryo-EM grid boxes (550) and whose receptacles (560) position and orient the grid boxes to allow automated grid storage with a single degree of freedom stage. The grid box form factor is standardized in the industry but grid slot (570) orientation within the box varies between manufacturers, and can be adapted as shown to facilitate loading with a single degree of freedom.

The stress-reducing foils described herein, including those shown in FIGS. 3-8, may each be fabricated as a single-piece foil sheet from gold (Au), chromium (Cr), as well as combinations and alloys thereof, and may each have a thickness of between about 20 and about 60 nm. These foil sheets may be fabricated by evaporation on masters covered with a release layer. The foils may then be floated off of the master by dissolving the release layer and then floated onto 200-300 mesh Cu or Au cryo-EM grids with square and hexagonal grid patterns. The foils have hole sizes of between about 0.3 and about 2.0 micrometers, and have selected areas constituting about 20% of the foil area covered with the stress relieving features.

Figure 12B:
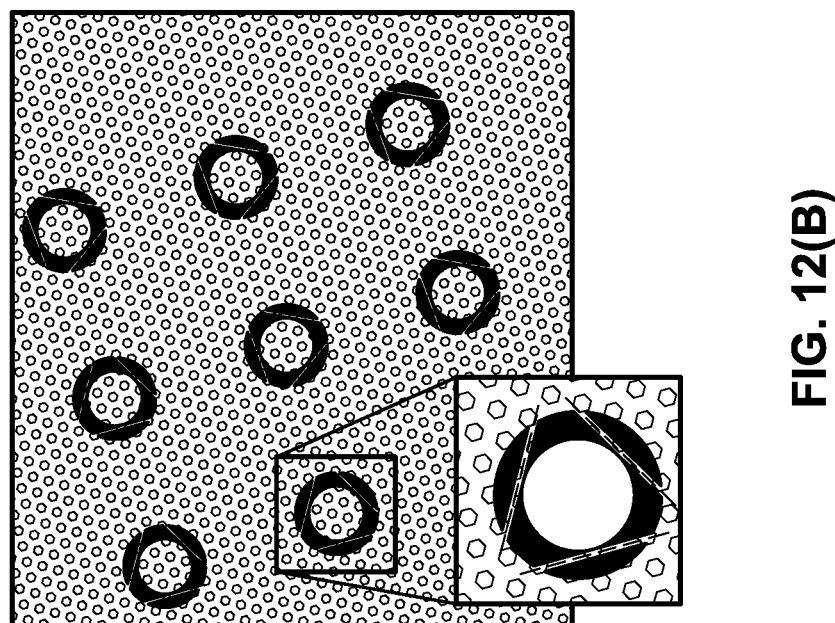
FIG. 12 (FIGS. 12(A) and 12(B)) shows representative foils having the pattern shown in FIG. 3 that are placed on two different styles of grids in accord with aspects of the disclosed concepts. The inset views in FIGS. 12(A) and 12(B) generally depict proof-of-concept micrographs that show the foil features of FIG. 3 work as described.
Figure 12A:
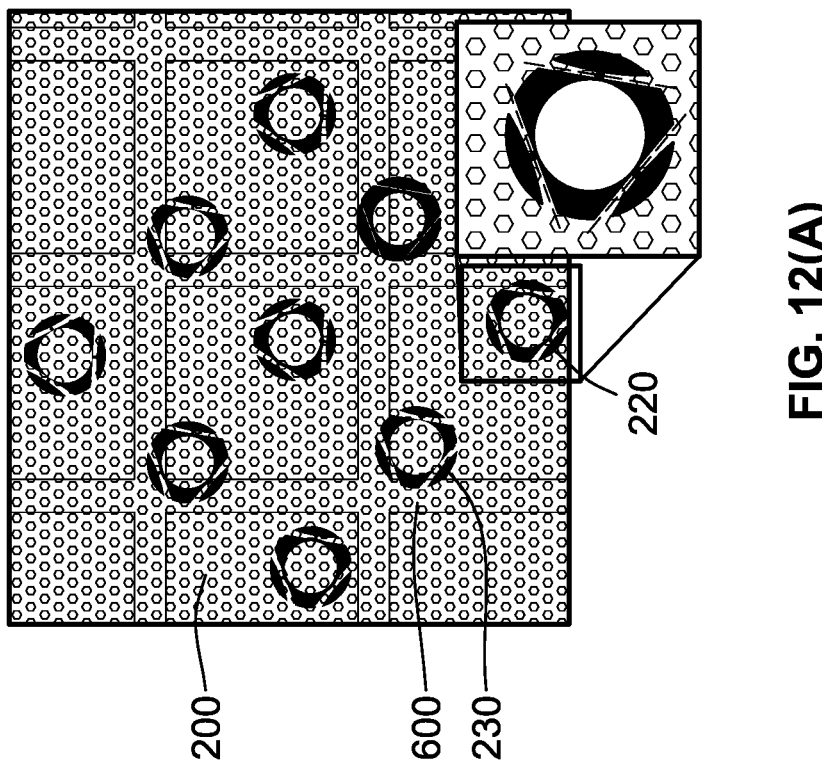

Foils having the stress relieving features of FIG. 3 in predefined foil regions may be fabricated from Au or Au/Cr alloy and placed on 300-mesh Cu or Au grids. FIG. 12, for example, shows optical micrographs of foils (200) with grids employing the pattern of FIG. 3. The diameter of the isolated regions (220) was chosen to ensure that some fraction of the regions would be entirely contained within single grid openings of width between roughly 55 and 65 micrometers. In FIG. 12(A), the foil (200) was placed on a 300 mesh square grid with "mushroom" profile grid bars, created by filling and overfilling a master during electro-forming. The foil (200) shows visible deformation around the grid bars (280) beneath it—which may make the grid bar positions more clearly visible. This is a characteristic deformation pattern for foils on commercial grids.

Within each grid square the foil appears to be undistorted. However, for grid openings where the foil (200) had the structure shown in FIG. 3, the tangential bars (230) that connect the isolated regions (220) to the surrounding foil may be deformed, indicating that the foil between grid bars is/was under tensile stress. The deformations of the tangential bars may also indicate that the isolated regions (220) are at least partially decoupled from that stress. The amount of deformation of the tangential bars may vary across the foil, providing a direct optical readout of the distribution of stress in the foil. This direct optical measurement of foil stress was used to optimize the process of foil placement on grids. As shown in FIG. 12(B), this optimization allowed production of foils on grids where the foil was essentially stress free.

Figure 13B:
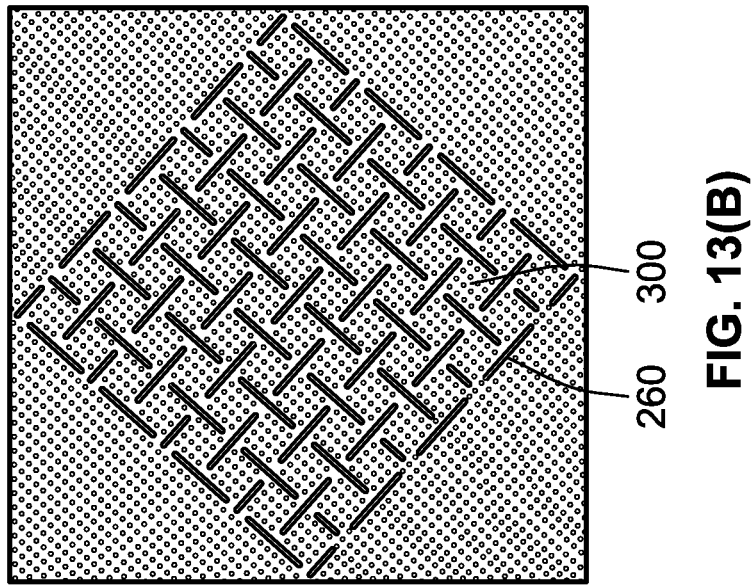
FIG. 13 (FIGS. 13(A) and 13(B)) shows representative foils having the pattern of holes and slits shown in FIG. 4(B) that are placed on two different styles of grids in accord with aspects of the disclosed concepts.

Foils having "auxetic" stress relieving features, such as those shown in FIGS. 4B and 6, in predefined foil regions may also be fabricated from Au or Au/Cr alloy and placed on 300-mesh Cu or Au grids. FIG. 13, for example, shows optical micrographs of foils (200) with an "auxetic" pattern, such as those shown in FIGS. 4(B) and 6, comprised of slits (260) arranged at right angles, on grids. In this example, the area covered by the slitted regions may be larger than the size of a single grid opening, but the square regions (300) defined by adjacent slits may be smaller than the grid openings. The slit widths may be about 2 to about 5 micrometers, and the slit lengths may be about 20 to about 25 micrometers. The hinge regions between slits may have lengths of about 1 to about 5 micrometers, and the square regions bounded by adjacent slits may have a dimension of about 12 to about 25 micrometers. In this example, the width of the square regions was chosen to ensure that some fraction of the regions would be entirely contained within single grid openings of width between about 55 and about 65 micrometers.

Figure 13A:
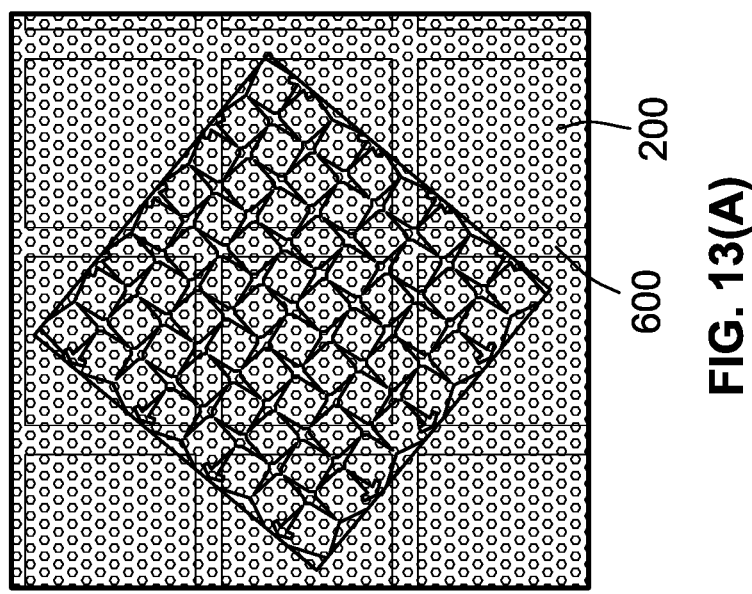

In FIG. 13(A), a foil having regions with a selected auxetic pattern may be placed on a 300-mesh square grid with "mushroom" profile grid bars. The foil may show visible deformation around the grid bars beneath it—which makes the grid bar positions more clearly visible. This is a characteristic deformation pattern for foils on commercial grids. The large residual stress in the foil is revealed by the opening of slits and the rotation of the squares between them. By using grids with a flat top profile and by improving the process by which foils are placed on the grids, foils that are essentially stress free—as indicated by the lack of rotation of the squares and opening of the slits—can be obtained (FIG. 13(B)). During cooling, this auxetic foil pattern should allow the sample to vitrify on foil that remains stress-free even though the grid may cool and contract much more slowly than the foil. Tiling the foil with auxetic regions surrounded by ordinary foil as in FIG. 8 preserves foil robustness during release and placement.

Imaging foil stress at room and cryogenic temperature. Foil stress and deformation are key metrics that can affect particle imaging performance. By starting with absolutely flat, stress-free foils as in FIGS. 12(B) and 13(B), subsequent foil deformations due to cooling can be optically detected via deviations from plane mirror reflections. Even more sensitive visualization of the foil's stress state is possible when the foil has the auxetic pattern in FIG. 4(B). The relation between overall strain (foil expansion) $\varepsilon = \Delta L / L$ of the auxetic/slitted regions and the rotation angle $\theta$ of the squares is $\theta = 2 \arccos(1/(1+\varepsilon))$. For strains of $10^{-5}$, $10^{-4}$, $10^{-3}$, and $10^{-2}$ the rotation angles are 0.5°, 1.6°, 5.1°, and 16.1°. Detecting rotations as small as 0.5° is straightforward. Whether the foil is initially under tensile stress (FIG. 13(A)) or is stress-free (FIG. 13(B)) determines the range of compressive and tensile strains that can be observed. These strains can be related to the underlying stress in the foil. Thus, the foil patterns of FIGS. 3(B) and 4 not only allow mechanical isolation of regions of the foil so that they remain nearly stress free, they also provide a sensitive method for optically visualizing and quantifying stress in the foil.

Features of this disclosure have been described in detail with reference to the illustrated examples: those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

Additional features and options may be defined by the following clauses:

Clause 1: a metal cryo-EM grid with a diameter of about 3.05 mm and a thickness of about 10-25 micrometers thick and covered on a top surface thereof by a foil with a thickness of about 10-50 nm, that may be of metal or a form of carbon, and that may have an array of through-holes with a of size about 0.2-2 micrometers, for use in single-particle cryo-electron microscopy, Clause 2: the foil of clause 1, having one or more interior areas structured so as to mechanically isolate those areas from surrounding areas and reduce foil stress in those interior areas, below the stress which may be present in surrounding areas created during assembly of the foil and the grid/manufacturing and that may arise due to differential contraction of foil and grid during cooling to cryogenic temperatures, and more specifically due to slower cooling of grid than foil.

Clause 3: the foil of clause 1 or 2, wherein one or more of the foil interior areas is connected to the surrounding area by bars/strips/beams that are tangent to the periphery of the interior area and that are connected to the surrounding area only at their ends, so that these bars deflect sideways at their point of contact to the interior area when the foil is under tensile stress.

Clause 4: the foil of any one of clauses 1-3, wherein the interior area is connected to each tangential bar via a small tab running perpendicular to the bar's axis.

Clause 5: the foil of any one of clauses 1-4, wherein the foil interior area bounded by the tangential bars/beams is smaller than the opening area of the underlying metal grid.

Clause 6: the foil of any one of clauses 1-5, wherein the foil interior area has a width and length dimension smaller than about 60 micrometers.

Clause 7: the foil of any one of clauses 1-6, where each of the tangential beams has a length that is at least 10 times larger than its width (e.g., 14-times larger).

Clause 8: the foil of any one of clauses 1-7, where the foil has interior areas that have a pattern of slits or apertures that allow release of stress when the foil is placed under tensile stress, so that some regions of the foil within these interior areas remain nearly stress free, while stress may be concentrated in other areas.

Clause 9: the foil of any one of clauses 1-8, wherein each of the slits has a length that is at least ten times larger than its width (e.g., 17-times larger).

Clause 10: the foil of any one of clauses 1-9, wherein the foil area enclosed by adjacent slits includes at least 16 holes for sample imaging.

Clause 11: the foil of any one of clauses 1-10, wherein the slits in the foil are arranged in a pattern that defines rectangular areas, and wherein these slits open up when the foil is placed under tensile stress, reducing stress in the interior area bounded by the slits.

Clause 12: the foil of any one of clauses 1-11, wherein the slits in the foil are arranged so that their long axes lies along one of two orthogonal axes in the plane of the foil, and where each end of each slit is in closest proximity to other slits only at their ends, and where adjacent parallel slits are colinear.

Clause 13: the foil of any one of clauses 1-12, wherein the slits in the foil are arranged so that their long axes lies along one of two orthogonal axes in the plane of the foil, and where the slits are oriented at right angles at points of closest proximity, and where a given slit is adjacent to two colinear and orthogonally oriented slits at its midpoint, such that when the foil is placed under tensile stress, the slits open up, the rectangular areas bounded by the slits rotate while remaining largely stress free, and where stress is concentrated in the hinge regions connecting each rectangular area to the surrounding foil.

Clause 14: the foil of any one of clauses 1-13, where the pattern of slits in the foil defines other auxetic patterns that allow the foil to expand when placed under tensile stress while leaving most of the foil within the patterned area stress-free, including slit patterns that define rotating triangles and parallelograms.

Clause 15: the foil of any one of clauses 1-14, wherein the square or rectangular foil interior area bounded slits is smaller than the opening area of the underlying metal grid.

Cause 16: the foil of any one of clauses 1-15, wherein the foil interior area has a width dimension and a length dimension each smaller than 60 micrometers.

Clause 17: the foil of any one of clauses 1-16, wherein the patterning of stress-relieving features in the foil is confined only to certain areas of the foil forming a fraction less than one of the total foil area, so that some areas of the foil retain full mechanical strength so as to make the foil more robust during handling, grid assembly, and use.

Clause 18: a system or device for automatically capturing and storing cryo-EM grids in grid boxes after plunge cooling, the system/device comprising: a container containing a liquid cryogen: a grid translation stage that translates the grid into a liquid cryogen and then to a release point within a liquid cryogen: a grid gripping mechanism attached to this stage that grips the grid and holds its plane perpendicular to the surface of the liquid cryogen, and then releases the grid after cooling at a release point within the liquid cryogen: a funnel device positioned within the liquid cryogen and with its upper opening vertically aligned with the release point: and a grid box with a series of receptacles for storing grids, positioned with one of its receptacles vertically aligned with the lower opening of the funnel device, such that when the grid is plunged into the liquid cryogen, translated to the release point within the liquid cryogen, and released, the grid falls under the influence of gravity down into and through the funnel and then into a receptacle in the grid box.

Clause 19: the system/device of clause 18, further comprising a stage within the liquid cryogen having at least one degree of freedom allowing motion in a plane perpendicular to the vertical at the end of the plunge path, and a platform that rests on the stage that has receptacles for grids, such that the platform may be translated or rotated to place each grid receptacle directly beneath the bottom outlet of the funnel device.

Clause 20: the system/device of clauses 18 or 19, where the platform has receptacles that hold grid boxes, and where the stage allows positioning of each receptacle in each grid box directly beneath the bottom outlet of the funnel device.

Clause 21: a system or device for optically measuring stress in a thin film, the system/device comprising: a thin film: a pattern of slits in a portion of the film that allow the slitted regions to exhibit auxetic behavior when the film is placed under tensile stress, and where the pattern of slits is arranged so that their long axes lies along one of two orthogonal axes in the plane of the foil, and where the slits are oriented at right angles at points of closest proximity, and where a given slit is adjacent to two colinear and orthogonally oriented slits at its midpoint: an optical microscope other means for imaging the film; where the rotation angles of adjacent square regions bounded by slits relative to each other is determined by the stress in the surrounding film and can be used to directly estimate that stress.

Clause 22: a method for measuring stress in a thin film, the method comprised of making a thin film with an auxetic pattern of slits in some portion of its area: observing the film using a microscope: and measuring the relative rotation angle of the principle axes of adjacent squares bounded by the slits.

Clause 23: a method or a computer-readable medium storing instructions for manufacturing and/or using any of the herein described foils, grids, grid+foil assemblies, and/or cryo-EM systems.

Clause 24: a cryo-EM system or a cryo-EM apparatus including any of the herein described foils, grids, and/or grid+foil assemblies.

Clause 25: a sample-support grid assembly for a cryo-electron microscopy system, the grid assembly comprising: a grid body with opposing first and second grid surfaces and multiple grid holes extending through the grid body from the first grid surface to the second grid surface: and a foil sheet seated against the first surface and covering a subset of the grid holes in the grid body, the foil sheet including multiple foil regions having multiple foil holes and separated by multiple elongated slots, wherein the elongated slots are configured to enable the foil regions to expand and/or to move with respect to each other.

Clause 26: the grid assembly of clause 25, wherein the grid body has a diameter or width of about 2.5 millimeters (mm) to about 3.5 mm.

Clause 27: the grid assembly of clause 25, wherein the grid body has a thickness of about 10 micrometers (μm) to about 25 μm.

Clause 28: the grid assembly of clause 25, wherein the grid body is a substantially flat single-piece structure.

Clause 29: the grid assembly of clause 25, wherein the grid body is formed from a rigid metallic material.

Clause 30: the grid assembly of clause 25, wherein each of the grid holes in the grid body has a width or diameter of about 20 micrometers (μm) to about 130 μm.

Clause 31: the grid assembly of clause 25, wherein the foil sheet has a thickness of about 10 nanometers (nm) to about 50 nm.

Clause 32: the grid assembly of clause 25, wherein the foil sheet is a substantially flat single-piece structure.

Clause 33: the grid assembly of clause 25, wherein the foil sheet is flexible and formed from a metallic or carbon material.

Clause 34: the grid assembly of clause 25, wherein each of the foil holes in the foil sheet has a width or diameter of about 0.2 micrometers (μm) to about 2.0 μm.

Clause 35: the grid assembly of clause 25, wherein the foil regions of the foil sheet include an inner foil region and an outer foil region surrounding the inner foil region, and wherein the elongated slots are interposed between and separate the outer foil region from the inner foil region.

Clause 36: the grid assembly of clause 35, wherein the foil sheet further includes multiple beams connecting the inner foil region to the outer foil region.

Clause 37: the grid assembly of clause 36, wherein the beams are tangential to an outer periphery of the inner foil region.

Clause 38: the grid assembly of clause 37, wherein the inner foil region has a circular or polygonal plan-view profile.

Clause 39: the grid assembly of clause 37, wherein the beams are spaced from the inner foil region and connected thereto by multiple radially elongated tabs.

Clause 40: the grid assembly of clause 37, wherein each of the beams is joined at opposing ends thereof to the outer foil region and at a central section thereof to the inner foil region.

Clause 41: the grid assembly of clause 37, wherein each of the beams has a beam width and a beam length approximately 7 to 10 times larger than the beam width.

Clause 42: the grid assembly of clause 37, wherein each of the beams has a rectilinear shape or a waveform shape.

Clause 43: the grid assembly of clause 25, wherein the foil regions of the foil sheet include a grid of polygonal foil regions, and wherein the elongated slots include multiple rows and columns of rectilinear slots interposed between and separating neighboring ones of the polygonal foil regions.

Clause 44: the grid assembly of clause 43, wherein the rows of the rectilinear slots are mutually parallel, the columns of the rectilinear slots are mutually parallel, and the rows are orthogonal to the columns.

Clause 45: the grid assembly of clause 43, wherein opposing ends of each of the rectilinear slots terminates adjacent opposing ends of multiple neighboring ones of the rectilinear slots.

Clause 46: the grid assembly of clause 43, wherein opposing ends of each of the rectilinear slots terminate adjacent a central region of neighboring ones of the rectilinear slots.

Clause 47: the grid assembly of clause 43, wherein each of the polygonal foil regions has a square-shaped plan-view profile and includes an array of the foil holes.

Clause 48: the grid assembly of clause 43, wherein each of the rectilinear slots includes a series of linearly aligned slits or a single continuous slit.

Clause 49: the grid assembly of clause 43, wherein each of the rectilinear slots has a slot width and a slot length approximately 7 to 10 times larger than the slot width.

What is claimed:

1. A sample-support grid assembly for a cryo-electron microscopy system, the grid assembly comprising:
  a grid body with opposing first and second grid surfaces and multiple grid holes extending through the grid body from the first grid surface to the second grid surface; and
  a foil sheet seated against the first surface and covering at least a subset of the grid holes in the grid body, the foil sheet including multiple foil regions separated by multiple elongated slots and each having multiple foil holes, wherein the elongated slots are configured to enable the foil regions of the foil sheet to expand and/or to move with respect to each other.

2. The grid assembly of claim 1, wherein the grid body has a diameter or width of about 2.5 millimeters (mm) to about 3.5 mm.

3. The grid assembly of claim 1, wherein the grid body has a thickness of about 10 micrometers (μm) to about 25 μm.

4. The grid assembly of claim 1, wherein the grid body is a substantially flat single-piece structure.

5. The grid assembly of claim 1, wherein the grid body is formed from a rigid metallic material.

6. The grid assembly of claim 1, wherein each of the grid holes in the grid body has a width or diameter of about 30 micrometers (μm) to about 110 μm.

7. The grid assembly of claim 1, wherein the foil sheet has a thickness of about 10 nanometers (nm) to about 50 nm.

8. The grid assembly of claim 1, wherein the foil sheet is a substantially flat single-piece structure.

9. The grid assembly of claim 1, wherein the foil sheet is flexible and formed from a metallic or carbon material.

10. The grid assembly of claim 1, wherein each of the foil holes in the foil sheet has a width or diameter of about 0.2 micrometers (μm) to about 2.0 μm.

11. The grid assembly of claim 1, wherein the foil regions of the foil sheet include an inner foil region and an outer foil region surrounding the inner foil region, and wherein the elongated slots are interposed between and separate the outer foil region from the inner foil region.

12. The grid assembly of claim 11, wherein the foil sheet further includes multiple beams connecting the inner foil region to the outer foil region.

13. The grid assembly of claim 12, wherein the beams are tangential to an outer periphery of the inner foil region.

14. The grid assembly of claim 1, wherein the foil regions of the foil sheet include a grid of polygonal foil regions, and wherein the elongated slots include multiple rows and multiple columns of rectilinear slots interposed between and separating neighboring ones of the polygonal foil regions.

15. The grid assembly of claim 14, wherein the rows of the rectilinear slots are mutually parallel, the columns of the rectilinear slots are mutually parallel, and the rows are substantially orthogonal to the columns.

16. The grid assembly of claim 14, wherein opposing ends of each of the rectilinear slots terminate adjacent opposing ends of multiple neighboring ones of the rectilinear slots.

17. The grid assembly of claim 14, wherein opposing ends of each of the rectilinear slots terminate adjacent central regions of neighboring ones of the rectilinear slots.

18. The grid assembly of claim 14, wherein each of the polygonal foil regions has a square-shaped plan-view profile and includes an array of the foil holes.

19. The grid assembly of claim 14, wherein each of the rectilinear slots includes a series of linearly aligned slits or a single continuous slit.

20. The grid assembly of claim 14, wherein each of the rectilinear slots has a slot width and a slot length approximately 7 to 10 times larger than the slot width.

\* \* \* \* \*